United States Patent
Derderian et al.

(10) Patent No.: US 7,157,385 B2
(45) Date of Patent: Jan. 2, 2007

(54) METHOD OF DEPOSITING A SILICON DIOXIDE-COMPRISING LAYER IN THE FABRICATION OF INTEGRATED CIRCUITRY

(75) Inventors: Garo J. Derderian, Boise, ID (US); Chris W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 10/655,699

(22) Filed: Sep. 5, 2003

(65) Prior Publication Data

US 2005/0054213 A1    Mar. 10, 2005

(51) Int. Cl.
*H01L 21/31* (2006.01)
(52) U.S. Cl. ............ 438/778; 438/779; 438/295; 438/424; 438/E21.275
(58) Field of Classification Search ............ None
See application file for complete search history.

(56) References Cited

U.S. PATENT DOCUMENTS

| | | | |
|---|---|---|---|
| 3,990,927 A | 11/1976 | Montier | |
| 4,474,975 A | 10/1984 | Clemons et al. | |
| 5,105,253 A | 4/1992 | Polllock | 357/49 |
| 5,156,881 A | 10/1992 | Okano et al. | |
| 5,182,221 A | 1/1993 | Sato | |
| 5,410,176 A | 4/1995 | Liou et al. | |
| 5,470,798 A | 11/1995 | Ouellet | |
| 5,604,149 A | 2/1997 | Paoli et al. | |
| 5,616,513 A | 4/1997 | Shepard | 438/402 |
| 5,719,085 A | 2/1998 | Moon et al. | |
| 5,741,740 A | 4/1998 | Jang et al. | |
| 5,770,469 A | 6/1998 | Uram et al. | |
| 5,776,557 A | 7/1998 | Okano et al. | |
| 5,786,039 A | 7/1998 | Brouquet | |
| 5,786,263 A | 7/1998 | Perera | 438/431 |
| 5,801,083 A | 9/1998 | Yu et al. | |
| 5,863,827 A | 1/1999 | Joyner | |
| 5,883,006 A | 3/1999 | Iba | |
| 5,888,880 A | 3/1999 | Gardner et al. | |
| 5,895,253 A | 4/1999 | Akram | |

(Continued)

FOREIGN PATENT DOCUMENTS

EP    0817251 A    1/1998

(Continued)

OTHER PUBLICATIONS

PCT/US2004/021156; Filed Jun. 30, 2004; Search Report.

(Continued)

*Primary Examiner*—Dung A. Le
(74) *Attorney, Agent, or Firm*—Wells St. John P.S.

(57) ABSTRACT

This invention includes methods of depositing a silicon dioxide comprising layer in the fabrication of integrated circuitry, and to methods of forming trench isolation in the fabrication of integrated circuitry. In one implementation, a method of depositing a silicon dioxide comprising layer in the fabrication of integrated circuitry includes flowing an aluminum containing organic precursor to a chamber containing a semiconductor substrate effective to deposit an aluminum comprising layer over the substrate. An alkoxysilanol is flowed to the substrate comprising the aluminum comprising layer within the chamber effective to deposit a silicon dioxide comprising layer over the substrate. At least one halogen is provided within the chamber during at least one of the aluminum containing organic precursor flowing and the alkoxysilanol flowing under conditions effective to reduce rate of the deposit of the silicon dioxide comprising layer over the substrate than would otherwise occur under identical conditions but for providing the halogen. Other implementations are contemplated.

21 Claims, 5 Drawing Sheets

U.S. PATENT DOCUMENTS

| | | | |
|---|---|---|---|
| 5,895,255 A | 4/1999 | Tsuchiaki | 438/427 |
| 5,904,540 A | 5/1999 | Sheng et al. | |
| 5,923,073 A | 7/1999 | Aoki et al. | 257/501 |
| 5,930,645 A | 7/1999 | Lyons et al. | |
| 5,943,585 A | 8/1999 | May et al. | |
| 5,950,094 A | 9/1999 | Lin et al. | |
| 5,960,299 A | 9/1999 | Yew et al. | |
| 5,972,773 A | 10/1999 | Liu et al. | |
| 5,981,354 A | 11/1999 | Spikes et al. | 438/424 |
| 5,989,978 A | 11/1999 | Peidous | 438/436 |
| 5,998,280 A | 12/1999 | Bergemont et al. | |
| 6,013,583 A | 1/2000 | Ajmera et al. | |
| 6,030,881 A | 2/2000 | Papasouliotis et al. | |
| 6,033,961 A | 3/2000 | Xu et al. | 438/295 |
| 6,051,477 A | 4/2000 | Nam | |
| 6,090,675 A | 7/2000 | Lee et al. | 438/301 |
| 6,156,674 A | 12/2000 | Li et al. | |
| 6,171,962 B1 | 1/2001 | Karlsson et al. | 438/692 |
| 6,187,651 B1 | 2/2001 | Oh | 438/435 |
| 6,191,002 B1 | 2/2001 | Koyanagi | 438/431 |
| 6,300,219 B1 | 10/2001 | Doan et al. | |
| 6,326,282 B1 | 12/2001 | Park et al. | 438/424 |
| 6,329,266 B1 | 12/2001 | Hwang et al. | 438/424 |
| 6,355,966 B1 | 3/2002 | Trivedi | 257/499 |
| 6,448,150 B1 | 9/2002 | Tsai et al. | 438/427 |
| 6,455,394 B1 | 9/2002 | Iyer et al. | |
| 6,534,395 B1 | 3/2003 | Werkhoven et al. | |
| 6,583,028 B1 | 6/2003 | Doan et al. | |
| 6,583,060 B1 | 6/2003 | Trivedi | 438/700 |
| 6,617,251 B1 | 9/2003 | Kamath et al. | 438/691 |
| 6,719,012 B1 | 4/2004 | Doan et al. | |
| 2001/0006255 A1 | 7/2001 | Kwon et al. | 257/751 |
| 2001/0006839 A1 | 7/2001 | Yeo | 438/435 |
| 2001/0041250 A1 | 11/2001 | Haukka et al. | |
| 2001/0046753 A1 | 11/2001 | Gonzalez et al. | 438/424 |
| 2002/0000195 A1 | 1/2002 | Kao et al. | |
| 2002/0004284 A1 | 1/2002 | Chen | 438/427 |
| 2002/0018849 A1 | 2/2002 | George et al. | |
| 2003/0032281 A1 | 2/2003 | Werkhoven et al. | |
| 2003/0129826 A1 | 7/2003 | Werkhoven et al. | |
| 2004/0082181 A1 | 4/2004 | Doan et al. | |
| 2004/0209484 A1 | 10/2004 | Hill et al. | |
| 2004/0266153 A1 | 12/2004 | Yongjun | |
| 2005/0009368 A1 | 1/2005 | Vaarstra | |
| 2005/0112282 A1 | 5/2005 | Gordon et al. | |
| 2005/0124171 A1* | 6/2005 | Vaartstra | 438/778 |

FOREIGN PATENT DOCUMENTS

| | | |
|---|---|---|
| JP | 02277253 A | 11/1990 |
| JP | 05-315441 | 11/1993 |
| JP | 06-334031 | 12/1994 |
| JP | 146224 | 1/1996 |
| WO | WO 02/27063 A2 | 4/2002 |

OTHER PUBLICATIONS

Chen et al., *Excimer Laser-Induced TI Silicidation to Eliminate the Fine-Line Effect for Integrated Circuity Device Fabrication*, 149 Journal of Electrochemical Society, No. 11, pp. G609-612 (2002).

Nishiyama et al., *Agglomeration Resistant Self-Aligned Silicide Process Using $N_2$ Implantation into $TiSi_2$*, 36 Jpn. Appl. Phys., Part 1, No. 6A, pp. 3639-3643 (Jun. 1997).

Wolf, *Chapter 13: Polycides and Salicides of TiSix, CoSi2, and NiSi*. Silicon Processing for the VLSI Era, vol. IV, pp. 603-604 (pre-2003).

Beekmann et al., *Sub-micron Gap Fill and In-Situ Planarisation using Flowfill™ Technology*, Electrotech 1-7 ULSI Conference, Portland, OR (Oct. 1995).

Horie et al., *Kinetics and Mechanism of the Reactions of $O(^3P)$ with $SiH_4$, $CH_3SiH_3$, $(CH_3)_2SiH_2$, and $(CH_3)_3SiH$*, 95 J. Phys. Chem 4393-4400 (1991).

Joshi et al., *Plasma Deposited Organosilicon Hydride Network Polymers as Versatile Resists for Entirely Dry Mid-Deep UV Photolithography*, 1925 SPIE 709-720 (Jan. 1993).

Kiermasz et al., *Planarisation for Sub-Micron Devices Utilising a New Chemistry*, Electrotech 1-2, DUMIC Conference, California (Feb. 1995).

Kojima et al., *Planarization Process Using a Multi-Coating of Spin-on-Glass*, V-MIC Conference, pp. 390-396 (Jun. 13-14, 1988).

Matsuura et al., *A Highly Reliable Self-planarizing Low-k Intermetal Dielectric for Sub-quarter Micron Interconnects*, 97 IEEE 785-788 (Jul. 1997).

Matsuura et al., *Novel Self-planarizing CVD Oxide for Interlayer Dielectric Applications*; 1994; 94 IEEE 117-120.

McClatchie et al. *Low Dielectric Constant Flowfill™ Technology for IMD Applications*, 7 pages (pre-Aug. 1999).

Withnail et al., *Matrix Reactions of Methylsilanes and Oxygen Atoms*, 92 J. Phys. Chem. 594-602 (1988).

Curtis et al, "APCVD TEOS: O3 Advanced Trench Isolation Applications", Semiconductor Fabtech, 9th Ed., p. 241-247.

George, S.M. et al., "Atomic layer controlled deposition of $SiO_2$ and $Al_2O_3$ using ABAB . . . binary reaction sequence chemistry", Applied Surface Science 82/83, Elsevier Science B.V., Jul. 10, 1994, p. 460-467.

Morishita et al. "Atomic-layer chemical-vapor-deposition of silicon-nitride", Applied Surface Science 112, Elsevier Science B.V., 1997, p. 198-204.

Yokoyama et al. "Atomic layer controlled deposition of silicon nitride and in situ growth observation by infrared reflection absorption spectroscopy", Applied Surface Science 112, Elsevier Science B.V., 1997, p. 75-81.

Gasser et al., "Quasi-monolayer deposition of silicon dioxide", Elsevier Science S.A., 1994, p. 213-218.

Shareef et al., "Subatmospheric chemical vapor deposition ozone/TEOS process for $SiO_2$ trench filling", J. Vac. Sci. Technol. B 13(4), Jul./Aug. 1995, p. 1888-1892.

U.S. Appl. No. 10/806,923, filed Mar. 22, 2004, Li et al.

Disclosed Anonymous 32246, "Substrate Contact with Closed Bottom Trenches", Research Disclosure, Feb. 1991, 1 page.

U.S. Appl. No. 10/931,524, filed Aug. 31, 2004, Sandhu.

Hausmann et al., "Catalytic vapor deposition of highly conformal silica nanolaminates", Department of Chemistry and Chemical Biology, Harvard Univerity, May 14, 2002, pp. 1-13.

Hausmann et al., *Rapid Vapor Deposition of Highly Conformal Silica Nanolaminates*, 298 SCIENCE 402-406 (Oct. 11, 2002).

Klaus et al., *Atomic Layer Deposition of $SiO_2$ Using Catalyzed Self-Limiting Surface Reactions*, 6 Surface Review and Letters, No. 3 and 4, pp. 435-448 (1999).

Miller et al., *Self-limiting chemical vapor deposition of an ultra-thin silicon oxide film using tri-(tert-butoxy) Silanol*, 397 Thin Solid Films 78-82 (2001).

U.S. Appl. No. 10/615,051, filed Jul. 7, 2003, Vaartstra.

* cited by examiner

METHOD OF DEPOSITING A SILICON DIOXIDE-COMPRISING LAYER IN THE FABRICATION OF INTEGRATED CIRCUITRY

TECHNICAL FIELD

This invention relates to methods of depositing a silicon dioxide comprising layer in the fabrication of integrated circuitry, and to methods of forming trench isolation in the fabrication of integrated circuitry.

BACKGROUND OF THE INVENTION

One commonly used material in the fabrication of integrated circuitry is silicon dioxide. Such might be utilized as essentially 100% pure, or in combination with other materials, including property-modifying dopants. Accordingly, silicon dioxide might be utilized as a mixture with other materials in forming a layer or layers, and may or may not constitute a majority of a given layer.

In certain instances of integrated circuitry fabrication, a substrate in process might have outwardly exposed surfaces of different compositions. Further in some instances, it is desirable to selectively deposit a material over one substrate area, as opposed to another substrate area. In some instances, it might be desirable to in a blanketing manner deposit a silicon dioxide comprising (or other) layer of substantially uniform thickness over a substrate. In other instances, it might be desirable to in a blanketing manner deposit such a layer to be thicker over one area than over another area.

SUMMARY OF THE INVENTION

This invention includes methods of depositing a silicon dioxide comprising layer in the fabrication of integrated circuitry, and to methods of forming trench isolation in the fabrication of integrated circuitry. In one implementation, a method of depositing a silicon dioxide comprising layer in the fabrication of integrated circuitry includes flowing an aluminum containing organic precursor to a chamber containing a semiconductor substrate effective to deposit an aluminum comprising layer over the substrate. An alkoxysilanol is flowed to the substrate comprising the aluminum comprising layer within the chamber effective to deposit a silicon dioxide comprising layer over the substrate. At least one halogen is provided within the chamber during at least one of the aluminum containing organic precursor flowing and the alkoxysilanol flowing under conditions effective to reduce rate of the deposit of the silicon dioxide comprising layer over the substrate than would otherwise occur under identical conditions but for providing the halogen.

In one implementation, a method of depositing a silicon dioxide comprising layer in the fabrication of integrated circuitry includes providing within a chamber a semiconductor substrate having an exposed outer first surface comprising at least one halogen and an exposed outer second surface effectively void of any halogen. An aluminum containing organic precursor is flowed to the chamber effective to deposit an aluminum comprising layer over the substrate. An alkoxysilanol is flowed to the substrate comprising the aluminum comprising layer within the chamber effective to selectively deposit a silicon dioxide comprising layer over the outer second surface as compared to the outer first surface.

In one implementation, a method of depositing a silicon dioxide comprising layer in the fabrication of integrated circuitry includes flowing an aluminum containing organic precursor to a chamber containing a semiconductor substrate effective to deposit an aluminum comprising layer over the substrate. An alkoxysilanol is flowed to the substrate comprising the aluminum comprising layer within the chamber effective to deposit a silicon dioxide comprising layer over the substrate. At least one of the aluminum containing organic precursor flowing and the alkoxysilanol flowing includes flowing of at least one halogen containing material from externally of the chamber to the chamber.

In one implementation, a method of depositing a silicon dioxide comprising layer in the fabrication of integrated circuitry includes flowing an aluminum containing organic precursor to a chamber containing a first semiconductor substrate effective to deposit an aluminum comprising layer over the first substrate. An alkoxysilanol is flowed to the first substrate comprising the aluminum comprising layer within the chamber effective to deposit a silicon dioxide comprising layer over the first substrate. After the deposit, the chamber is cleaned with at least one halogen containing species. After the cleaning, at least one of activated oxygen, activated nitrogen, and activated hydrogen is provided within the chamber effective to react with residual halogen present within the chamber from the cleaning. After the providing, an aluminum containing organic precursor is flowed to the chamber containing a second semiconductor substrate effective to deposit an aluminum comprising layer over the second substrate. An alkoxysilanol is flowed to the second substrate comprising the aluminum comprising layer within the chamber effective to deposit a silicon dioxide comprising layer over the second substrate. The reacting of the at least one of activated oxygen, the activated nitrogen, and the activated hydrogen is effective to increase growth rate of the silicon dioxide comprising layer over the second substrate than would otherwise occur under identical conditions in the absence of such prior reacting.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
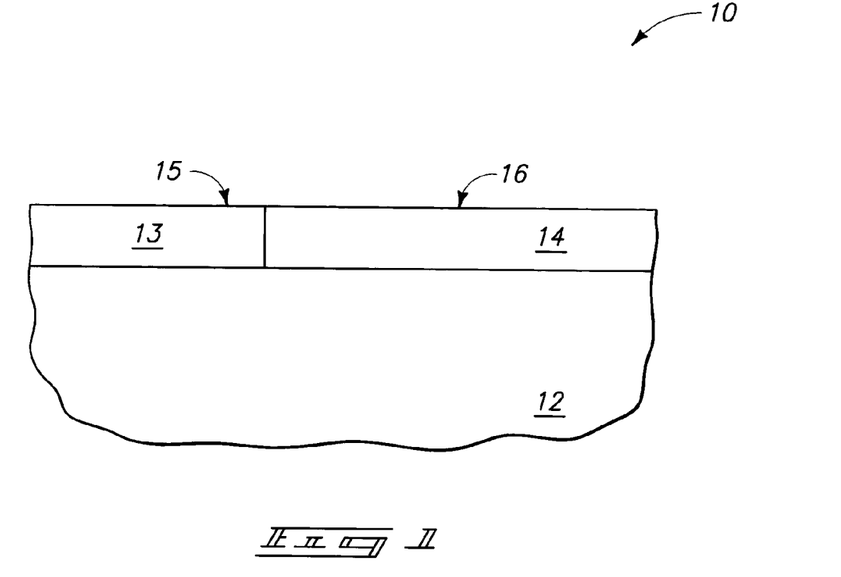
FIG. 1 is a diagrammatic sectional view of a semiconductor wafer fragment in process in accordance with an aspect of the invention.

An exemplary method of depositing a silicon dioxide comprising layer in the fabrication of integrated circuitry is described in a first exemplary embodiment with respect to FIGS. 1–4. Referring to FIG. 1, an exemplary semiconductor substrate 10 includes a bulk monocrystalline substrate 12. Any other semiconductor substrate is contemplated, including silicon-on-insulator, and/or employing other semiconductive materials. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural unless otherwise indicated. Materials/Layers 13 and 14 are formed over base substrate 12. Material 13 has an exposed outer first surface 15 comprising at least one halogen, and material 14 comprises an exposed outer second surface 16 which is effectively void of any halogen, as will be clarified below. An exemplary preferred material for outer surface 15 is a nitride, for example tantalum nitride. By way of example only, such can be deposited using chemical vapor deposition and/or atomic layer deposition utilizing $TaX_5$ (where "X" is a halogen, preferably selected from the group consisting of F, Cl, Br and I) and $NH_3$ as precursors. An exemplary preferred temperature for such deposition is 400° C., with 2 Torr being an exemplary pressure. Such tantalum nitride film will typically incorporate anywhere from 0.1% atomic to 7% atomic halogen therein.

Figure 2:
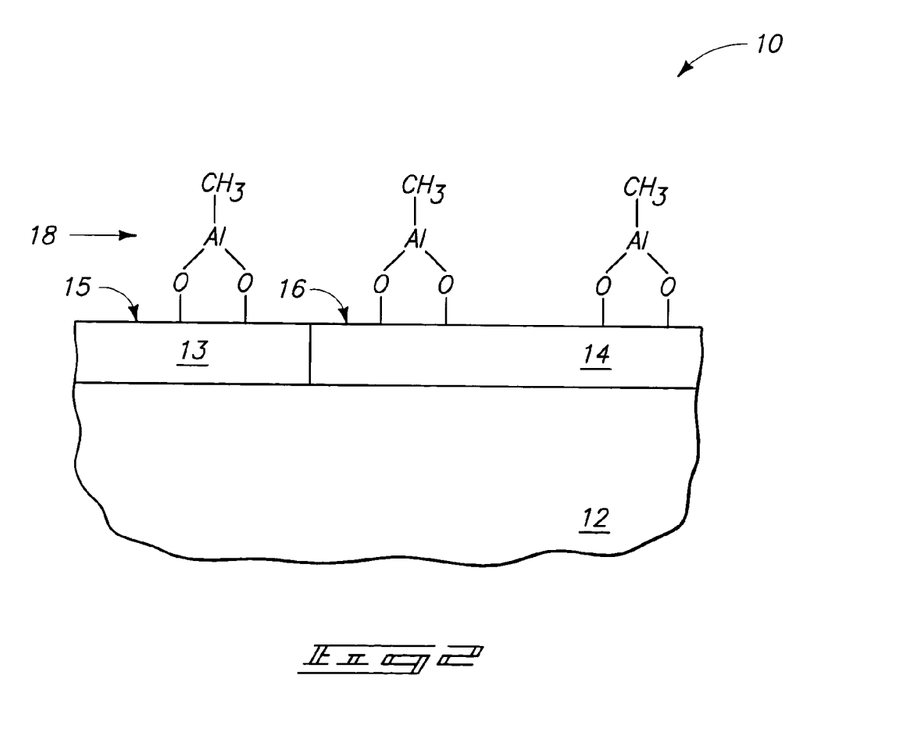
FIG. 2 is a view of the FIG. 1 wafer fragment at a processing step subsequent to that shown by FIG. 1.

Referring to FIG. 2, substrate 10 has been provided within a suitable chamber, and an aluminum containing organic precursor flowed thereto effective to deposit an aluminum comprising layer 18 over the substrate. As shown, aluminum comprising layer 18 is deposited over both exposed outer first surface 15 and exposed outer second surface 16. Such might alternately only deposit over outer second surface 16, or deposit to some lesser degree over outer surface 15 as compared to outer surface 16. The aluminum comprising layer might be in elemental or alloy form, but will more likely be in a metal compound form, for example as shown. The invention was reduced-to-practice with respect to forming an aluminum compound comprising methyl aluminum and aluminum oxide, for example the chemisorbed Al—O—$CH_3$ species, as shown. Such can be formed by chemical vapor deposition, atomic layer deposition, or any other deposition, whether existing or yet-to-be developed. An example technique to produce the illustrated FIG. 2 construction includes atomic layer deposition whereby outer surfaces 15 and 16 are initially hydroxylated to form pending/chemisorbed OH groups. A methyl aluminum, for example trimethyl-aluminum or aluminum dimethylamide, can then be provided to produce the illustrated layer 18, for example as described in Hausmann et al., *Rapid Vapor Deposition of Highly Conformal Silica Nanolaminates*, SCIENCE MAGAZINE, Vol. 298, pp. 402–406 (2002). Such might largely produce the layer 18 as shown, and might also produce, alternately or in combination therewith, a dimethylaluminide molecule with aluminum atoms bonded to a single oxygen atom pending from the substrate. Other aluminum containing materials are, of course, contemplated. Regardless, in one preferred implementation, the aluminum layer which is formed would preferably be no more than 3 monolayers thick, and perhaps more preferably only be about a single saturated monolayer thick. A specific example to produce the illustrated layer 18 includes a one second pulse of trimethylaluminum from an ampoule at room temperature, followed by 30 seconds of purging with an inert gas, for example with both the trimethylaluminum pulse and the purging using 100 sccm flow of Ar, and a wafer temperature of 230° C.

Figure 3:
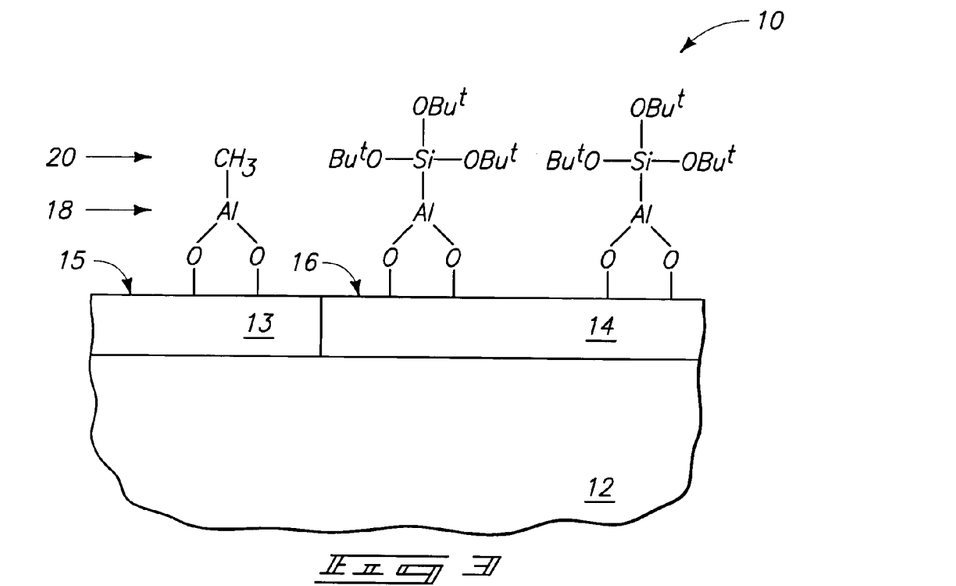
FIG. 3 is a view of the FIG. 2 wafer fragment at a processing step subsequent to that shown by FIG. 2.

Referring to FIG. 3, an alkoxysilanol is flowed to the substrate within the chamber. As used herein, "alkoxysilanol" is intended to include any alkoxy silane alcohol, for example including alkoxy silane diols and alkoxy silane triols. Exemplary preferred alkoxysilanols include tristertbutoxysilanol and tristertpentoxysilanol, with FIG. 3 depicting a layer 20 resulting from utilizing tristerbutoxysilanol.

Figure 4:
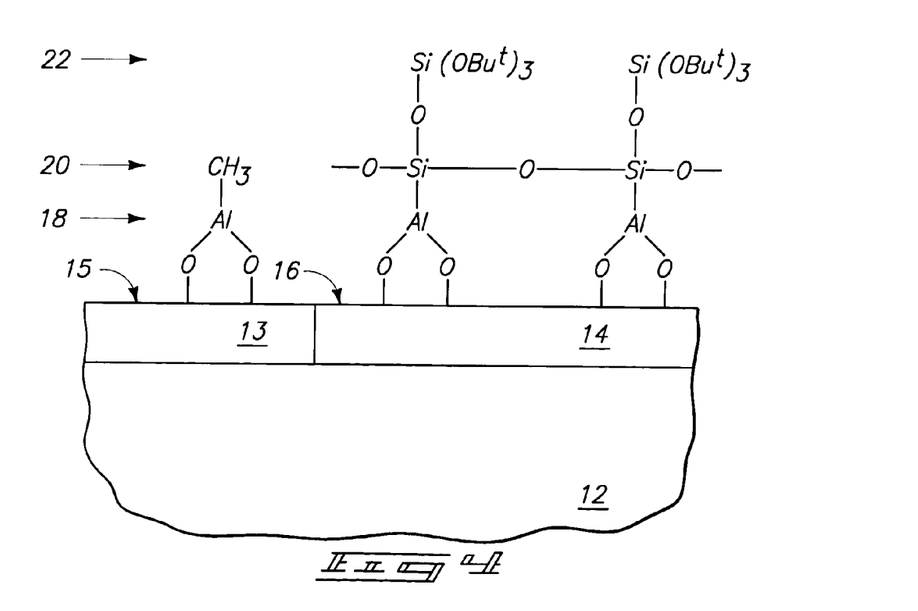
FIG. 4 is a view of the FIG. 3 wafer fragment at a processing step subsequent to that shown by FIG. 3.

Referring to FIG. 4, continuing exposure to such alkoxysilanol has resulted in the formation of another layer 22. Continuing exposure results in the formation of more layers effective to selectively deposit a silicon dioxide comprising layer 20/22 over outer second surface 16 as compared to outer first surface 15. In the context of this document, a selective deposit of one material relative to another is at a ratio of at least 2:1. Preferably, the selective deposit is at a ratio of at least 5:1, more preferably at a ratio of at least 10:1, and even more preferably at a ratio of at least 50:1. Preferably, the selective deposit is at a ratio of at least 99:1 for at least the first 100 Angstroms of thickness of the silicon dioxide comprising layer, and more preferably for at least the first 250 Angstroms of thickness of the silicon dioxide comprising layer. Exemplary techniques for forming growing layer 20/22 are as described in the Hausmann et al. article referred to above. The alkoxysilanol flowing to produce the exemplary FIG. 4 composition, after producing the FIG. 3 composition, might be continuous, for example at variable rates or at a substantially constant rate. For example continuing with the specific example described above, following the thirty second purge, a continuous sixty second pulse of tristerbutoxysilanol by flowing 100 sccm of Ar over an ampoule containing tristerbutoxysilanol at about 70° C. can occur, followed by another sixty second purge with Ar. Alternately by way of example only, the flowing of the alkoxysilanol after forming the FIG. 3 or other composition might be pulsed, meaning the result of discrete alkoxysilanol pulsings having some time interval therebetween where alkoxysilanol is not flowing to the surfaces. Preferred substrate temperature during the flowing is from 200° C. to 300° C., and more preferably from 225° C. to 250° C., although other temperatures are contemplated. An exemplary preferred pressure range is from 100 mTorr to 10 Torr.

Fluorine presence in the deposition chamber has been discovered to degrade the rate of deposition of the silicon dioxide comprising layer in connection with a process which initially deposits an aluminum comprising layer over a substrate, followed by the flowing of an alkoxysilanol thereto. Accordingly, the provision of one outer deposition surface to comprise fluorine, with another outer deposition surface being effectively void of fluorine, enables a selective deposition of a silicon dioxide comprising layer. A similar effect is effect is expected with each of the other halogens, most preferably any of Cl, Br and I. It is believed that as little as 1% atomic, or even less, incorporated halogen with respect to a deposition surface will reduce or eliminate the growth of a silicon dioxide comprising layer thereover. Greater quantities of halogen are expected to increase the degree of selectivity. By way of example only and not of limitation, it is theorized that the halogen may be reacting with the aluminum to preclude or at least reduce reaction of the alkoxysilanol over the halogen containing surface. Alternately, perhaps the halogen is inhibiting aluminum from otherwise acting in a catalytic manner with the alkoxysilanol which otherwise facilitates continued growth of the silicon dioxide comprising layer over a non-halogen containing surface.

Silicon dioxide comprising layer growth may be substantially amorphous, and may be self-limited to a certain thickness, for example to about 500 Angstroms to 700 Angstroms. In other words, continued exposure to alkoxysilanol may be expected to result in increasing growth of the silicon dioxide comprising layer being formed to some point where growth stops in spite of increasing exposure to alkoxysilanol. Regardless and further by way of example only, a selective silicon dioxide comprising layer growth might become more blanket after an initial layer has been deposited, as silicon dioxide would then be deposited onto silicon dioxide even in the non-selective area. Accordingly, the selective deposit might form some of the silicon dioxide comprising layer over the outer first surface 15. If so, it might be desirable to remove the silicon dioxide comprising layer from over outer first surface 15 and then repeat the alkoxysilanol flowing. Further and regardless, if the selective deposit is self-limiting to silicon dioxide comprising deposition after completing deposition of the aluminum comprising layer, and more deposition is desired, flowing of the aluminum containing organic precursor could be repeated followed by flowing of the alkoxysilanol for at least another cycle.

Outer surface 16 might be totally void of any halogen (meaning no detectable halogen) or may merely be effectively void of any halogen. In the context of this document, "effectively void of any halogen" does not preclude some halogen presence, as long as such is not sufficient to limit a selective depositing effect of at least 2:1 as described herein.

Figure 5:
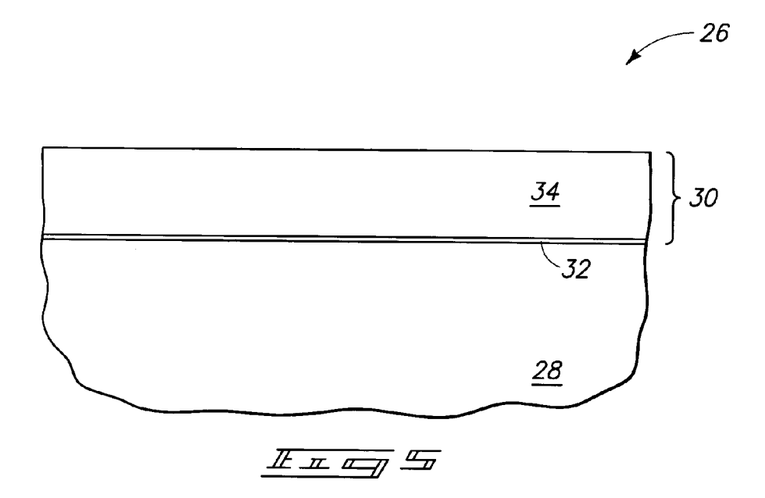
FIG. 5 is a diagrammatic sectional view of a semiconductor wafer fragment in process in accordance with an aspect of the invention.

The above exemplary processing was generally and generically described relative to any semiconductor substrate having an exposed outer first surface comprising at least one halogen and an exposed outer second surface effectively void of any halogen. Initial exemplary implementations of the above and other processings are described in additional embodiments, for example as next depicted by FIGS. 5–9. By way of example only, such depict exemplary methods of forming trench isolation in the fabrication of integrated circuitry. FIG. 5 shows a semiconductor substrate 26 comprising a bulk monocrystalline silicon or other semiconductive material substrate 28. A masking layer 30 comprising at least one halogen (most preferably fluorine, with Cl, Br and I being lesser preferred halogens) is formed over semiconductor substrate 28. Such is depicted as comprising a pad oxide layer 32 and an overlying nitride comprising layer 34, for example tantalum nitride incorporating at least one halogen as described above.

Figure 6:
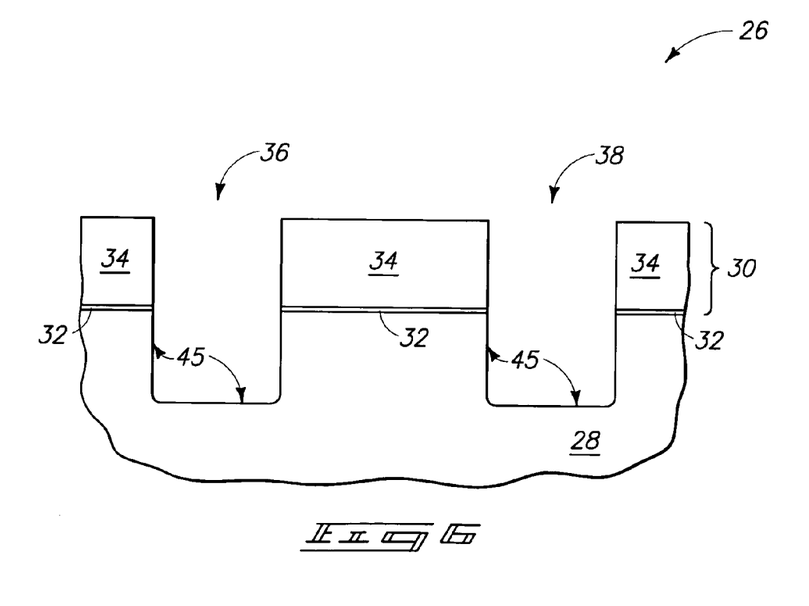
FIG. 6 is a view of the FIG. 5 wafer fragment at a processing step subsequent to that shown by FIG. 5.

Referring to FIG. 6, isolation trenches 36 and 38 have been etched through halogen containing masking layer 30 into the semiconductive material of substrate 28/26. A thermal oxide layer or other layer (not shown) might be provided now or subsequently, for example by exposing substrate 26 to thermal oxidizing conditions. Regardless, isolation trenches 36 and 38 within the semiconductive material are provided to comprise some deposition surface 45 which is effectively void of any halogen.

Figure 7:
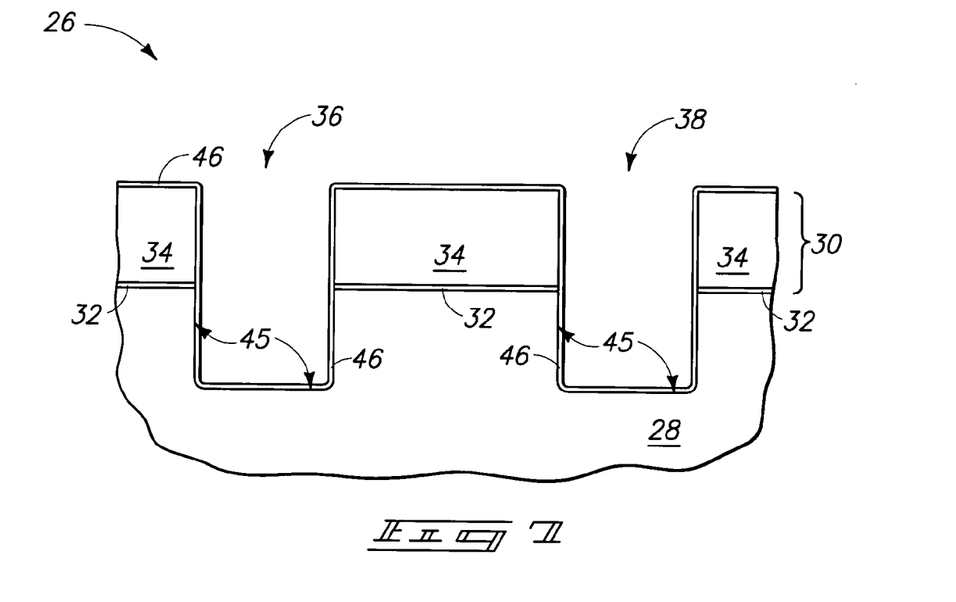
FIG. 7 is a view of the FIG. 6 wafer fragment at a processing step subsequent to that shown by FIG. 6.

Referring to FIG. 7, an aluminum containing organic precursor has been flowed to substrate 26 effective to deposit an aluminum comprising layer 46 over the substrate. Attributes as described above, for example with respect to layer 18 of the first described embodiment, are preferably utilized relative to forming the illustrated metal comprising layer 46. Aluminum comprising layer 46 is shown as being deposited both within isolation trenches 36 and 38 and over halogen containing masking layer 30, although such is in no way required.

Figure 8:
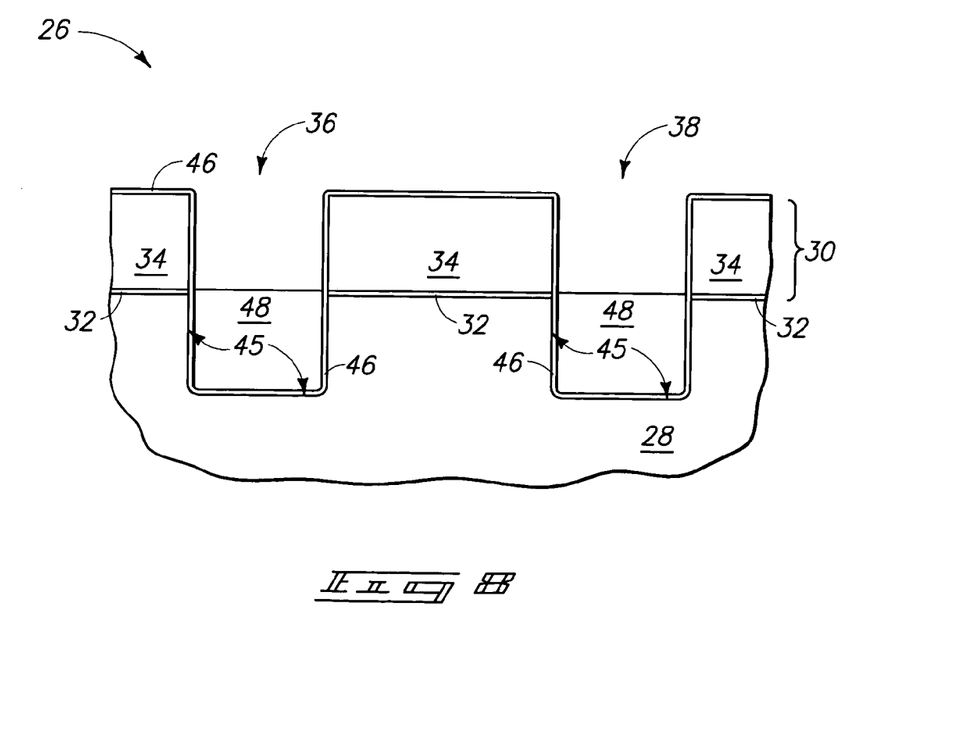
FIG. 8 is a view of the FIG. 7 wafer fragment at a processing step subsequent to that shown by FIG. 7.

Referring to FIG. 8, an alkoxysilanol has been flowed to substrate 26 effective to selectively deposit a silicon dioxide comprising layer 48 within isolation trenches 36 and 38, as compared to over halogen comprising masking layer 30. Such deposition is depicted as being effective to fill, and slightly overfill, those portions of isolation trenches 36 and 38 received within semiconductive material 28. Alternately by way of example only, such formation might only partially fill such portions of the trenches, and a subsequent insulative or other material layer deposition conducted to more completely fill such trenches.

Figure 9:
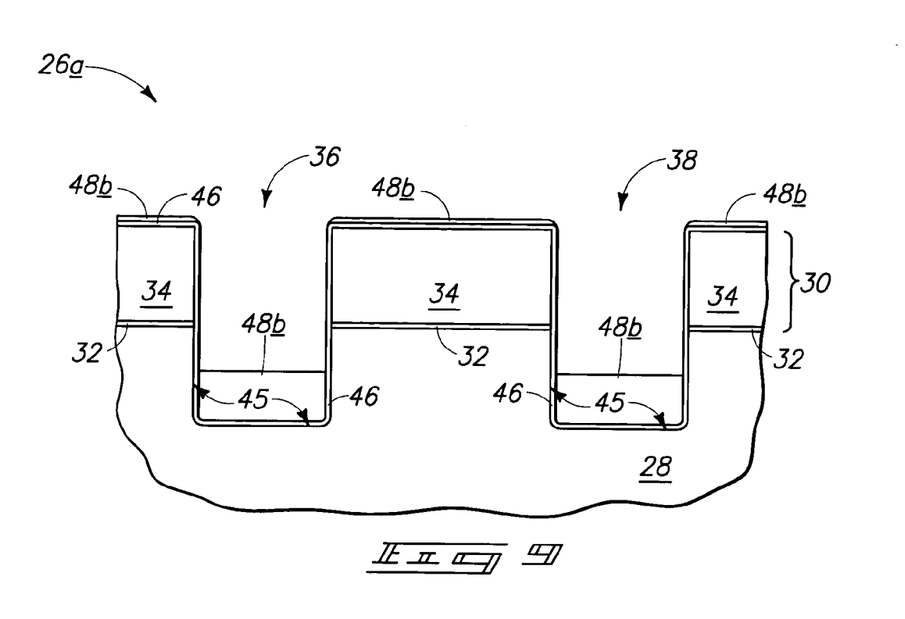
FIG. 9 is an alternate view of the FIG. 7 wafer fragment at a processing step subsequent to that shown by FIG. 7.

FIG. 9 depicts a substrate 26a in a method whereby the selective deposit forms some of silicon dioxide comprising layer 48b over halogen containing masking layer 30. In such instance, it might be desirable to remove the silicon dioxide comprising layer 48b from over halogen containing masking layer 30, for example by chemical-mechanical polishing or some other existing or yet-to-be-developed technique. Thereafter, the alkoxysilanol flowing can be continued, if desired, to completely or partially fill the remaining volume of the trenches. Of course, the aluminum containing organic precursor flowing might also be conducted or repeated prior to flowing the alkoxysilanol.

In another aspect of the invention, a method of depositing a silicon dioxide comprising layer in the fabrication of integrated circuitry is hereby disclosed. Such includes flowing an aluminum containing organic precursor to a chamber containing a semiconductor substrate effective to deposit an aluminum comprising layer over the substrate. Exemplary techniques are like those described above with respect to trimethylaluminum flowing to a hydroxylated surface. Subsequently, an alkoxysilanol is flowed to the substrate comprising the aluminum comprising layer within the chamber effective to deposit a silicon dioxide comprising layer over the substrate. Exemplary preferred attributes are as described above, for example with respect to the formation of silicon dioxide comprising layer 20/22, but not necessarily selectively on one area of the substrate as compared to another area of the substrate. In accordance with this aspect of the invention, at least one of the aluminum containing organic precursor flowing and the alkoxysilanol flowing includes the flowing of at least one halogen containing material from externally of the chamber to the chamber. For example, the halogen containing material might be with only one or both of the alkoxysilanol precursor flowing and the aluminum containing organic precursor flowing. Most preferred is halogen containing material flowing with the alkoxysilanol flowing. The silicon dioxide layer might be formed in a blanketing manner on the substrate, or be selectively formed on some areas of the substrate versus other areas of the substrate. Exemplary halogen containing materials include $X_2$, HX, halocarbons (i.e., $CX_4$) and hydrohalocarbons (i.e., $CHS_3$, $CH_2X_2$, etc.), where "X: is a halogen.

Regardless, the halogen containing material might be plasma activated, or not, and if so within and/or externally of the deposition chamber.

In one implementation, the halogen containing material flowing impacts the rate of growth of the silicon dioxide comprising layer, and accordingly, the rate of growth of such layer is controlled by or with the halogen containing material flowing. For example and by way of example only, increasing flow rate of a given halogen containing material will tend to reduce the rate of deposition, whereas decreased rates of flowing of the given halogen containing material provides a greater rate of growth, or reduced rate of growth as compared to flowing no halogen-containing material to the chamber. Regardless, in such implementation, the rate of growth of the silicon dioxide comprising layer can be controlled with the halogen containing material flowing, either with respect to its composition and/or rate of flow.

In one implementation, the silicon dioxide comprising layer may comprise aluminum oxide. The quantity of aluminum oxide within the silicon dioxide comprising layer can be controlled with the halogen containing material flowing (i.e., with one or both of the aluminum containing organic precursor flowing and the alkoxysilanol flowing). For example, as the rate of flow of a halogen containing material increases, the quantity of aluminum oxide formed in the silicon dioxide comprising layer increases. This may be desirable, by way of example only, in establishing desired wet or other etch rates of the silicon dioxide comprising layer. For example, the more aluminum oxide within a silicon dioxide comprising layer, the slower the etch rate utilizing wet an HF etching chemistry. Other film properties might also be impacted, such as film morphology and gap filling or other conformality in the deposition of the layer over a substrate.

In another implementation, such flowing of a halogen containing material from externally of the chamber to the chamber might be conducted with at least one of the aluminum containing organic precursor flowing and the alkoxysilanol flowing for yet-to-be determined/developed reasons or purposes.

Regardless, in one aspect of the invention, a method of depositing a silicon dioxide comprising layer in the fabrication of integrated circuitry is further disclosed. Such comprises flowing an aluminum containing organic precursor to a chamber containing a semiconductor substrate effective to deposit an aluminum comprising layer over the substrate. Preferred attributes are as described above with respect to the use of trimethylaluminum over a hydroxylated surface. Thereafter, an alkoxysilanol is flowed to the substrate comprising the aluminum comprising layer within the chamber effective to deposit a silicon dioxide comprising layer over the substrate. At least one halogen is provided within the chamber during at least one of the aluminum containing organic precursor and the alkoxysilanol flowing under conditions effective to reduce the rate of deposit of the silicon dioxide comprising layer over the substrate than would otherwise occur under identical conditions but for providing the halogen. Such aspect as just-stated is generic to the first described embodiment, although such is in no way so limited. For example and by way of example only, the first described embodiment provides halogen within the chamber from deposited halogen containing material present on the substrate. Such is effective to reduce the rate of the deposit of a silicon dioxide comprising layer over the substrate for example as-described with respect to being selective to deposit at a much lower rate, or not deposit at all, over some portion of the substrate. With respect to the above described latter aspect, halogen is provided by flowing a halogen containing material from externally of the chamber to the substrate. Of course, such aspects might be combined with halogen coming from both a substrate within the chamber and from externally of the same by a gas/plasma flow. Further of course, the silicon dioxide comprising layer might be formed in a blanketing manner on the substrate, or selectively formed on some areas of the substrate versus other areas of the substrate.

Pertinent to another considered aspect of the invention, chambers within which silicon dioxide comprising layers are formed, for example as described above utilizing an aluminum containing organic precursor and alkoxysilanol, are occasionally cleaned. Such cleaning is typically conducted with a halogen containing species, for example $NX_3$, where "X" is a halogen. It has been found that subsequent deposition of such silicon dioxide comprising layers immediately after such a cleaning, particularly with $NF_3$, is at a considerably reduced rate. Where throughput maximization is desired, it might be useful to minimize such effect. It is theorized that the reduced rate of deposit is the result of one or more residual halogen containing species which remain in the reactor, possibly from adherence to internal chamber surfaces and hardware.

In another considered aspect of the invention, a method of depositing a silicon dioxide comprising layer in the fabrication of integrated circuitry includes flowing an aluminum containing organic precursor to a chamber containing a first semiconductor substrate effective to deposit an aluminum comprising layer over the first substrate. Exemplary and preferred attributes are as described above with respect to trimethylaluminum usage over a hydroxylated surface. Regardless, an alkoxysilanol is flowed to the first substrate comprising the aluminum comprising layer within the chamber effective to deposit a silicon dioxide comprising layer over the first substrate. Subsequent deposition might occur onto the first substrate within the chamber, or the same or other depositions within the chamber might also be conducted with respect to one or more other substrates.

Regardless, after the deposit, the chamber is cleaned with a halogen containing species. A preferred example includes $NX_3$ (preferably $NF_3$) as described above, and with or without plasma or other activation. Preferably, the first substrate is removed from the chamber prior to such cleaning. Regardless, after the cleaning at least one of activated oxygen, activated nitrogen, and activated hydrogen is provided within the chamber effective to react with residual halogen present within the chamber from the cleaning. An exemplary preferred activated oxygen includes $O_3$ and/or any other oxygen containing material in an activated state, for example from plasma activation within or external of the chamber. By way of example only, other examples include plasma $O_2$ or activated compounds containing N and O, such as $NO_x$. Such also constitutes an exemplary activated nitrogen containing material, with an $N_2$ plasma being another specific example. An exemplary preferred activated hydrogen includes $H_2$ and/or any other hydrogen containing material in an activated state, for example from plasma activation within or external of the chamber.

The reacting might be effective to react the residual halogen into some other non-impacting, or lower impacting species, which remains within the chamber. Alternately or in addition thereto, the reacting might be effective to form some gaseous product containing the halogen which is exhausted from the chamber. Further by way of example only, residual halogen in the chamber might be present in the form of $X_2$ or HX, where "X" is a halogen. These and other halogen containing species might preferably be reacted to form NF$_3$, some O—F, and/or some H—F species which would preferably be exhausted from the chamber.

After providing one or more of the activated oxygen, activated nitrogen, and activated hydrogen, an aluminum containing organic precursor is flowed to the chamber which contains a second semiconductor substrate effective to deposit an aluminum comprising layer over the second substrate. Preferably, the second substrate has not been provided into the chamber until completion of the treatment with the activated oxygen, the activated nitrogen, and/or the activated hydrogen. The aluminum containing organic precursor utilized might be the same as that in forming an aluminum comprising layer over the first substrate, or might be different, in forming the same or different composition aluminum comprising layer.

Regardless and thereafter, an alkoxysilanol is flowed to the second substrate having the aluminum comprising layer within the chamber effective to deposit a silicon dioxide comprising layer over the second substrate. Again, the alkoxysilanol might be the same as or different from that used to deposit the silicon dioxide comprising layer over the first substrate. Regardless, the reacting of the at least one of activated oxygen, the activated nitrogen, and the activated hydrogen is effective to increase the growth rate of the silicon dioxide comprising layer over the second substrate than would otherwise occur under identical conditions in the absence of such prior reacting with such at least one of activated oxygen, activated nitrogen, and activated hydrogen.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of depositing a silicon dioxide-comprising layer in the fabrication of integrated circuitry, comprising:
    flowing an aluminum-containing organic precursor to a chamber containing a semiconductor substrate effective to deposit an aluminum-comprising layer over the substrate;
    flowing an alkoxysilanol to the substrate comprising the aluminum-comprising layer within the chamber effective to deposit a silicon dioxide-comprising layer over the substrate; and
    providing at least one halogen within the chamber during at least one of the aluminum-containing organic precursor flowing and the alkoxysilanol flowing under conditions effective to reduce rate of the deposit of the silicon dioxide-comprising layer over the substrate than would otherwise occur under identical conditions but for providing the at least one halogen.

2. The method of claim 1 wherein the aluminum-containing organic precursor comprises a methyl aluminum.

3. The method of claim 1 wherein the aluminum-comprising layer comprises an aluminum compound.

4. The method of claim 3 wherein the aluminum compound comprises a methyl aluminum.

5. The method of claim 3 wherein the aluminum compound comprises an aluminum oxide.

6. The method of claim 3 wherein the aluminum compound comprises a methyl aluminum oxide.

7. The method of claim 1 wherein the aluminum-comprising layer is no more than 3 monolayers thick.

8. The method of claim 1 wherein the alkoxysilanol comprises tristertbutoxysilanol.

9. The method of claim 1 wherein the alkoxysilanol comprises tristertpentoxysilanol.

10. The method of claim 1 wherein the halogen is provided during the alkoxysilanol flowing.

11. The method of claim 1 wherein the halogen is provided by flowing a halogen-containing precursor to the chamber while flowing the alkoxysilanol.

12. The method of claim 1 wherein the halogen is provided from deposited material on the substrate which contains the halogen.

13. The method of claim 1 wherein the silicon dioxide-comprising layer is formed in a blanketing manner on the substrate.

14. The method of claim 1 wherein the silicon dioxide-comprising layer is selectively formed on some areas of the substrate versus other areas of the substrate.

15. The method of claim 1 wherein said flowing of alkoxysilanol is continuous.

16. The method of claim 1 wherein said flowing of alkoxysilanol is continuous at a substantially constant rate.

17. The method of claim 1 wherein said flowing of alkoxysilanol is pulsed.

18. The method of claim 1 wherein the halogen comprises fluorine.

19. The method of claim 1 wherein the halogen comprises chlorine.

20. The method of claim 1 wherein the halogen comprises bromine.

21. The method of claim 1 wherein the halogen comprises iodine.

* * * * *

UNITED STATES PATENT AND TRADEMARK OFFICE
CERTIFICATE OF CORRECTION

| | | |
|---|---|---|
| PATENT NO. | : 7,157,385 B2 | Page 1 of 1 |
| APPLICATION NO. | : 10/655699 | |
| DATED | : January 2, 2007 | |
| INVENTOR(S) | : Derderian et al. | |

It is certified that error appears in the above-identified patent and that said Letters Patent is hereby corrected as shown below:

Title Page, Item (56), Page 2, OTHER PUBLICATIONS, First Column, please delete "*Aggiomeration*" after "Nishiyama et al." and insert --*Agglomeration*--.

Col. 4, line 66, please delete "effect is" after "effect is".

Col. 6, line 67, please delete ""X:"" after "where" and insert --"X"--.

Col. 7, line 31, please delete "an" after "wet".

Signed and Sealed this

Twenty-first Day of August, 2007

JON W. DUDAS
*Director of the United States Patent and Trademark Office*